(12) United States Patent
Karakane et al.

(10) Patent No.: US 10,854,576 B2
(45) Date of Patent: Dec. 1, 2020

(54) SEMICONDUCTOR DEVICE AND MANUFACTURING METHOD THEREOF

(71) Applicant: Toshiba Memory Corporation, Tokyo (JP)

(72) Inventors: Yuji Karakane, Kanagawa (JP); Masatoshi Fukuda, Yokkaichi (JP); Soichi Homma, Yokkaichi (JP); Masayuki Miura, Yokkaichi (JP); Naoyuki Komuta, Kanagawa (JP); Yuka Akahane, Yokkaichi (JP); Yukifumi Oyama, Yokkaichi (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 8 days.

(21) Appl. No.: 15/694,838

(22) Filed: Sep. 3, 2017

(65) Prior Publication Data

US 2018/0261574 A1    Sep. 13, 2018

(30) Foreign Application Priority Data

Mar. 10, 2017    (JP) .................................. 2017-046390

(51) Int. Cl.
*H01L 21/225*    (2006.01)
*H01L 25/065*    (2006.01)
(Continued)

(52) U.S. Cl.
CPC ........ *H01L 25/0657* (2013.01); *H01L 21/565* (2013.01); *H01L 21/6836* (2013.01); *H01L 23/293* (2013.01); *H01L 23/49838* (2013.01); *H01L 24/14* (2013.01); *H01L 24/16* (2013.01); *H01L 24/17* (2013.01); *H01L 24/32* (2013.01); *H01L 24/73* (2013.01); *H01L 24/81* (2013.01); *H01L 24/83* (2013.01); *H01L 24/92* (2013.01); *H01L 25/50* (2013.01);
(Continued)

(58) Field of Classification Search
CPC .................................................. H01L 21/2254
See application file for complete search history.

(56) References Cited

U.S. PATENT DOCUMENTS 6,696,764 B2    2/2004  Honda
7,829,992 B2    11/2010  Sugino et al.
(Continued)

FOREIGN PATENT DOCUMENTS

JP    2010245383 A    10/2010
JP    2013157363 A    8/2013
(Continued)

OTHER PUBLICATIONS

U.S. Appl. No. 15/445,988, filed Mar. 1, 2017 (First Inventor: Yuji Karakane).

*Primary Examiner* — Moazzam Hossain
*Assistant Examiner* — Hajar Kolahdouzan
(74) *Attorney, Agent, or Firm* — Kim & Stewart LLP

(57) ABSTRACT

A semiconductor device includes a wiring substrate having a first surface, a stacked body on the first surface, the stacked body comprising a first chip, a second chip having a through via and positioned between the first chip and the first surface, and a third chip, a first resin contacting the first surface and the third chip, and a second resin sealing the stacked body. The first and second resins are made of different materials.

13 Claims, 12 Drawing Sheets

(51) Int. Cl.
*H01L 23/29* (2006.01)
*H01L 25/00* (2006.01)
*H01L 21/56* (2006.01)
*H01L 21/683* (2006.01)
*H01L 23/00* (2006.01)
*H01L 23/498* (2006.01)
*H01L 21/768* (2006.01)
*H01L 23/31* (2006.01)

(52) U.S. Cl.
CPC .... *H01L 21/76897* (2013.01); *H01L 23/3128* (2013.01); *H01L 23/49816* (2013.01); *H01L 23/49822* (2013.01); *H01L 23/49827* (2013.01); *H01L 24/13* (2013.01); *H01L 2224/131* (2013.01); *H01L 2224/1319* (2013.01); *H01L 2224/13023* (2013.01); *H01L 2224/13111* (2013.01); *H01L 2224/13113* (2013.01); *H01L 2224/13118* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/1415* (2013.01); *H01L 2224/1416* (2013.01); *H01L 2224/16113* (2013.01); *H01L 2224/16145* (2013.01); *H01L 2224/16146* (2013.01); *H01L 2224/16225* (2013.01); *H01L 2224/16237* (2013.01); *H01L 2224/1703* (2013.01); *H01L 2224/17051* (2013.01); *H01L 2224/17181* (2013.01); *H01L 2224/17505* (2013.01); *H01L 2224/2919* (2013.01); *H01L 2224/32225* (2013.01); *H01L 2224/32245* (2013.01); *H01L 2224/73253* (2013.01); *H01L 2224/81005* (2013.01); *H01L 2224/81065* (2013.01); *H01L 2224/8185* (2013.01); *H01L 2224/81191* (2013.01); *H01L 2224/81192* (2013.01); *H01L 2224/81815* (2013.01); *H01L 2224/83005* (2013.01); *H01L 2224/83191* (2013.01); *H01L 2224/83192* (2013.01); *H01L 2224/9211* (2013.01); *H01L 2224/9212* (2013.01); *H01L 2225/06513* (2013.01); *H01L 2225/06517* (2013.01); *H01L 2225/06541* (2013.01); *H01L 2225/06548* (2013.01); *H01L 2225/06565* (2013.01); *H01L 2225/06586* (2013.01); *H01L 2924/0635* (2013.01); *H01L 2924/0665* (2013.01); *H01L 2924/1438* (2013.01); *H01L 2924/3511* (2013.01)

(56) References Cited

U.S. PATENT DOCUMENTS

| | | | |
|---|---|---|---|
| 9,059,010 | B2 | 6/2015 | Yoshida et al. |
| 9,449,949 | B2 | 9/2016 | Komuta |
| 2010/0258931 | A1 | 10/2010 | Yoshida et al. |
| 2012/0098145 | A1 | 4/2012 | Yoshida et al. |
| 2014/0008798 | A1* | 1/2014 | Baba ............... H01L 23/49838 257/738 |
| 2014/0284817 | A1 | 9/2014 | Sato et al. |
| 2014/0377886 | A1* | 12/2014 | Koyanagi ............... H01L 25/50 438/5 |
| 2015/0069596 | A1 | 3/2015 | Kawasaki et al. |
| 2016/0035705 | A1 | 2/2016 | Watanabe |
| 2016/0141273 | A1* | 5/2016 | Tsuji ................... H01L 23/544 257/737 |
| 2016/0249457 | A1 | 8/2016 | Min et al. |
| 2016/0329304 | A1* | 11/2016 | Hatakeyama ........... H01L 24/97 |

FOREIGN PATENT DOCUMENTS

| | | |
|---|---|---|
| JP | 2013-219231 | 10/2013 |
| JP | 2014183278 A | 9/2014 |
| JP | 2015-005637 | 1/2015 |
| JP | 2015008210 A | 1/2015 |
| JP | 2015-056563 | 3/2015 |
| JP | 2015177007 A | 10/2015 |
| JP | 5904302 | 4/2016 |
| KR | 20150131130 A | 11/2015 |
| KR | 20160022862 A | 3/2016 |
| TW | 200302529 A | 8/2003 |
| TW | 200810063 A | 2/2008 |
| TW | 201448071 A | 12/2014 |
| TW | 201515187 A | 4/2015 |
| WO | 2014148485 A1 | 9/2014 |

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2017-046390, filed Mar. 10, 2017, the entire contents of which are incorporated herein by reference.

FIELD

Embodiments described herein relate generally to a semiconductor device and manufacturing method thereof.

BACKGROUND

There has been proposed a method for stacking multiple semiconductor chips one over the other and sealing the stacked semiconductor chips in a resin for a device required to have a large capacity such as a NAND flash memory. Attention has been paid to a stacking scheme based on TSVs (through silicon vias) in order to further increase the transmission rate of signals in or out of each semiconductor chip.

DETAILED DESCRIPTION

Embodiments hereof provide a semiconductor device and manufacturing method capable of more efficiently sealing a semiconductor chip stacked body in a resin.

In general, according to one embodiment, a semiconductor device includes a wiring substrate having a first surface, a stacked body on the first surface, the stacked body comprising a first chip, a second chip having a through via and positioned between the first chip and the first surface, and a third chip, a first resin contacting the first surface and the third chip, and a second resin sealing the stacked body. The first and second resins are made of different materials.

First Embodiment

A semiconductor device according to a first embodiment will be described hereinafter with reference to FIGS. 1 to 13. In the following illustration of the drawings, like elements are denoted by the same reference symbols. However, the drawings may differ from an actual semiconductor device in the relationship between thicknesses and planar dimensions, a scaling ratio, and the like, and are provided herein as schematic figures.

Also, in this specification, an XYZ orthogonal coordinate system is used for convenience of explanation. In this coordinate system, two directions parallel to the main surface of the wiring substrate and mutually orthogonal to each other are defined as the X direction and the Y direction, and a direction orthogonal to both of the X and Y directions is assumed to be the Z direction (height direction).

Figure 1:
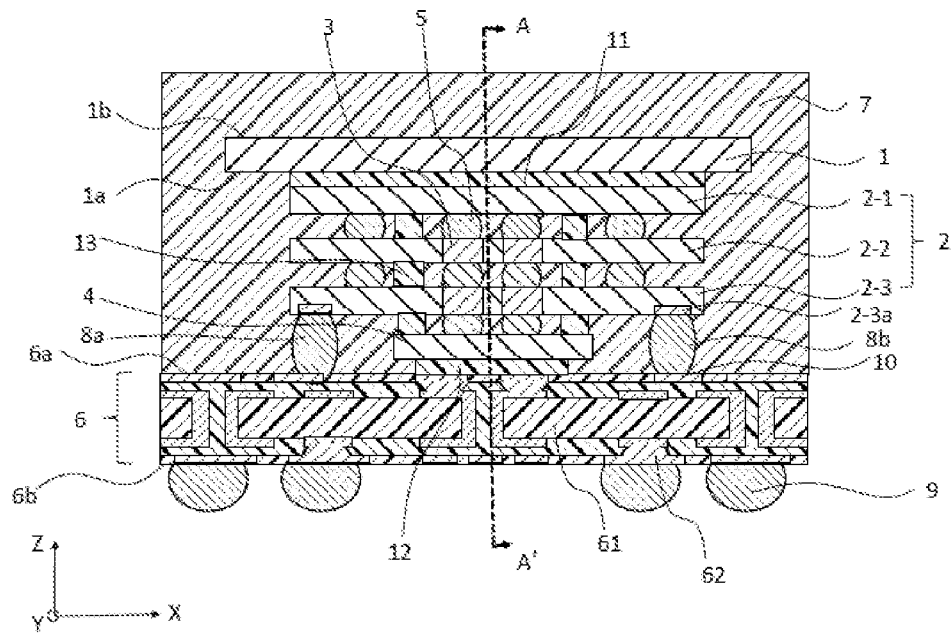
FIG. 1 is a cross-sectional view illustrating a configuration of a semiconductor device according to a first embodiment.
Figure 2:
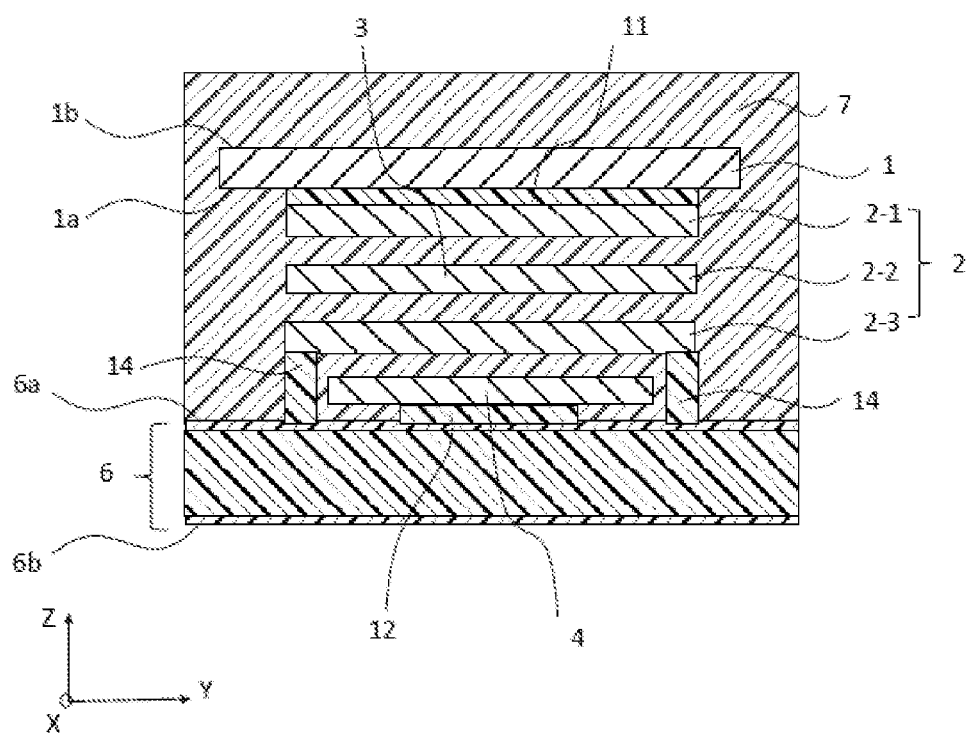
FIG. 2 is a cross-sectional view illustrating the configuration of the semiconductor device according to the first embodiment.

FIG. 1 is a cross-sectional view illustrating a configuration of the semiconductor device according to the first embodiment. FIG. 2 is a schematic diagram showing a cross section of the semiconductor device in the YZ plane corresponding to section A-A' in FIG. 1. As illustrated in FIG. 1, the semiconductor device according to the present embodiment includes a stacked chip body, which includes a supporting substrate 1, semiconductor chips 2, through silicon vias (TSV) 3, a semiconductor chip 4 (logic LSI), metal bumps 5, a wiring substrate 6, and a molded resin 7. For example, an epoxy resin or the like is used as the molded resin 7.

The semiconductor device according to the present embodiment is configured such that the stacked chip body, including the supporting substrate 1 and the semiconductor chips 2 therein, is mounted onto the wiring substrate 6 by flip-chip bonding of the stacked chip body on the wiring substrate 6, and a resin is molded over the stacked chip body and between the individual components thereof to seal the gaps between the semiconductor chips 2 of the stacked chip body.

The supporting substrate 1 has a first surface 1a that faces the wiring substrate 6 and a second surface 1b on the opposite side of the wiring substrate from the first surface 1a. A semiconductor chip 2-1 is bonded to the first surface 1a of the supporting substrate 1 with an adhesive 11.

For example, a metal plate such as a lead frame, a silicon substrate or a film material is used as the supporting substrate 1. Examples of the adhesive 11 include a die attach film and a resin.

A plurality of metal bumps 5 are formed on a surface of the semiconductor chip 2-1 facing away from the supporting substrate 1, and the metal bumps 5 are electrically connected to the through silicon vias 3 formed in a semiconductor chip 2-2. The through silicon vias 3 in the semiconductor chip 2-2 are also similarly electrically connected to the through silicon vias 3 formed in a semiconductor chip 2-3 by the metal bumps 5. A rewiring layer (not illustrated) is formed on the wiring substrate 6 side of the semiconductor chip 2-3. The through silicon vias 3 in the semiconductor chip 2-3 are electrically connected to the semiconductor chip 4 by the metal bumps 5. The supporting substrate 1, the semiconductor chips 2, and the semiconductor chip 4 are collectively referred to as the "chip stacked body".

An adhesive 12 is provided between the semiconductor chip 4 and the wiring substrate 6. For example, a NCP (Non Conductive Paste) or a NCF (Non Conductive Film) are used as the adhesive 12. For NCP and NCF, for example, a resin containing an acrylic resin or an epoxy resin is used, but there is no particular limitation on the constituents. For example, the material of the adhesive 12 is different from the material of the molded resin 7. Providing the adhesive 12 between the semiconductor chip 4 and the wiring substrate 6 makes it easier to fix the stacked chip body on the wiring substrate.

Examples of the semiconductor chips 2 include memory chips of a NAND flash memory or the like. A substrate such as a silicon, SiC or GaN substrate can be used for the semiconductor chips 2 and 4; however, the type of the substrate is not limited to a specific one.

The through silicon vias 3 provided in the semiconductor chips 2-2 and 2-3 transfer electric potentials and signals to or from the semiconductor chips 2-1 and 2-2.

The semiconductor chips 2 are connected in parallel to the common semiconductor chip 4 (by bus connection). That is, data input/output lines of the plurality of semiconductor chips 2 are connected in parallel to common data buses formed by the through silicon vias 3 in a chip stacking direction.

For example, Au, Ni, Cu, Sn, Bi, Zn, In or an alloy thereof is used for the metal bumps 5. Electrode pads containing Au, Ni, Cu, Al, Pd or an alloy thereof may be employed as an alternative to the metal bumps 5.

While three semiconductor chips 2 are illustrated in the present embodiment, the number of semiconductor chips 2 is not limited to a specific number. Similarly, the number of metal bumps 5 is not limited to a specific number.

The wiring substrate 6 includes a resin insulating layer 61 and a metal wiring layer 62. The insulating layer 61 includes a core layer and a build-up layer. The stacked chip body is placed on the wiring substrate 6 so that the semiconductor chip 4 is closest to the wiring substrate 6 and the supporting substrate 1 is farthest from the wiring substrate 6.

Figure 11:
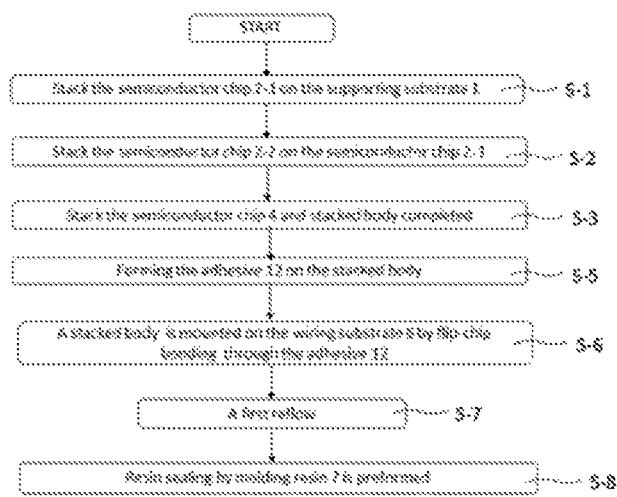
FIG. 11 is a flowchart illustrating steps of the second manufacturing method according to the first embodiment.

The wiring substrate 6 has a first surface 6a on which the stacked chip body is placed and a second surface 6b on the opposite side thereof as the first surface 6a, as illustrated in, for example, FIG. 1. External connection terminals 9 are formed on the second surface 6b of the wiring substrate 6. When the semiconductor device is used as a BGA package, solder balls or protruding terminals plated with solder, Au or the like are used as the external connection terminals 9 as shown in FIG. 11. When the semiconductor device is used as an LGA package, metal lands are used as the external connection terminals 9.

Internal connection terminals 10 are provided on the first surface 6a of the wiring substrate 6. The internal connection terminals 10 on the first surface 6a side of the wiring substrate 6 are connected to electrode pads 2-3a on the lowermost of the semiconductor chips 2 (chip 2-3) of the stacked chip body by, for example, solder bumps 8. In FIG. 1, the solder bumps 8 are formed in at least two places, for example, as the first solder bumps 8a and the second solder bumps 8b. The internal connection terminals 10 function as connection sections (connection pads) when the wiring substrate 6 is connected to the stacked chip body, and are electrically connected to the external connection terminals 9 through a wiring network of the wiring substrate 6. The number of solder bumps 8 is not particularly limited, but it is desirable to provide a plurality of solder bumps 8 in order to reduce the incidence of connection failure between the chips 2 and between the chip 2-3 and the wiring substrate 6.

The stacked chip body located on the first surface 6a of the wiring substrate 6, the metal bumps 5, and the solder bumps 8 are entirely covered with the molded resin 7 and sealed therein.

As illustrated in FIG. 1, an adhesive 13 may be provided between the semiconductor chips 2 and between the lowermost of the semiconductor chips 2 and the semiconductor chip 4, and an adhesive 14 may be provided between the wiring substrate 6 and the chip stacked body. Providing the adhesives 13 and 14 can ensure a strong connection among the semiconductor chips 2 and between the wiring substrate 6 and the chip stacked body and can reduce misalignment therebetween.

Additionally when the elastic modulus or the glass transition point (Tg) of the molded resin 7 has the relationship with respect to the adhesives 12, 13, of the adhesive 12 Tg<the adhesive 13 Tg<the molded resin 7 Tg, the incidence of interfacial peeling at the surface between the semiconductor chip 4 and the molded resin 7 can be further suppressed. Furthermore, in the case where the thermal expansion coefficient (CTE) has the relationship of the resin mold 7 CTE<the adhesive 12 CTE<the adhesive 13 CTE, the warping of the wiring substrate 6 is further suppressed, and the incidence of connection failure of the first and second solder bumps 8a, 8b to the wiring substrate 6 is reduced. For example, SA (Spacer Adhesive) is used as the adhesive 13. The adhesive 13 is made of a material including acrylic resin, epoxy resin, or the like. For example, NCP is used as the adhesive 14, but there is no particular limitation on the adhesive material composition. The glass transition point of the materials of the present embodiment is measured by the DMA (Dynamic Mechanical Analysis) method, and the thermal expansion coefficient is measured by the TMA (Thermomechanical Analysis) method. The relevant modulus of elasticity is, for example, the flexural modulus.

Next, the layout of the above-described adhesives 12 and 13 on the wiring substrate 6 shown in plan view in the XY plane will be described.

3A to 3E are XY plan views showing the first surface 6a of the wiring substrate 6 excluding the stacked chip body and the molded resin 7. The region where the first solder bump 8a is formed is defined as a first solder bump region 8a' and the region where a second solder bump 8b is formed is defined as a second solder bump region 8b'. Further, a region where the semiconductor chip 4 is mounted to the wiring substrate 6 is indicated by a dotted line.

Figure 3A:
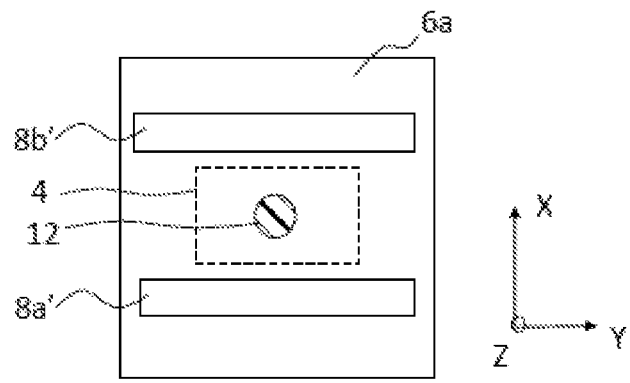
FIGS. 3A-3E are plan views illustrating the configuration of the semiconductor device according to the first embodiment.
Figure 3B:
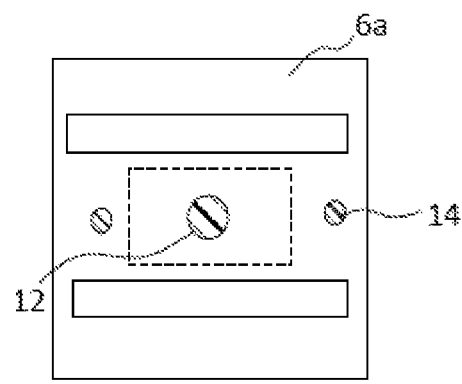
Figure 3C:
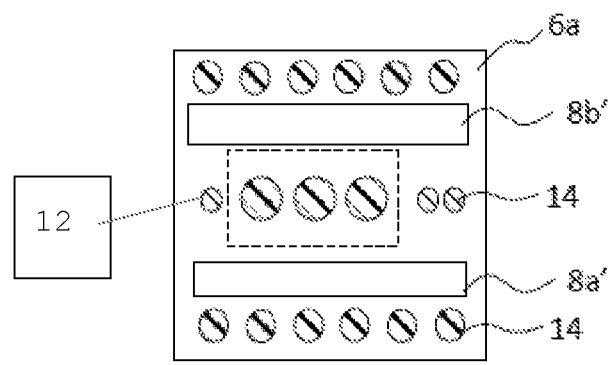
Figure 3D:
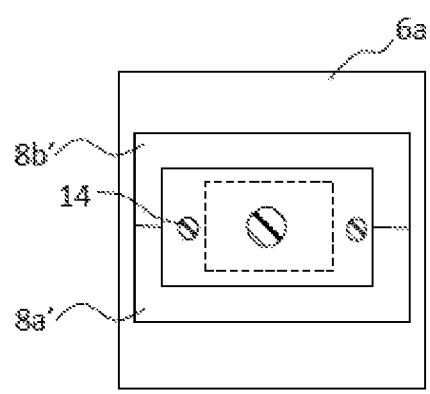

As shown in FIG. 3A, the semiconductor device according to the present embodiment has an adhesive 12 located at least between the semiconductor chip 4 and the wiring substrate 6. As shown in FIGS. 3B and 3D, an adhesive 14 for bonding the semiconductor chip 2 and the wiring substrate 6 is provided. The number of, and layout of, the adhesive(s) 14 are not particularly limited, but for example, the adhesive(s) 12 and the adhesive(s) 14 are positioned along a straight line path in the Y direction. As shown in FIG. 3C, the number of adhesive(s) 12 and the number of adhesive(s) 14 may be two or more, respectively, or the adhesive 14 may be further provided outside the first and second solder bump regions 8a' and 8b'. The term "outer side" refers to a region on the side opposite to the semiconductor chip 4 in the X direction with respect to the first and second solder bump regions 8a' and 8b'. On the other hand, "inner" refers to a region on the semiconductor chip 4 side in the X direction with respect to the first and second solder bump regions 8a' and 8b'.

For example, the adhesive surface area of the adhesive 12 positioned between the semiconductor chip 4 and the wiring substrate 6 is larger than the adhesion surface area of the adhesive 14 positioned between the semiconductor chip 2 and the wiring substrate 6 and provided inside of the first and second solder bump regions 8a' and 8b'.

Figure 3E:
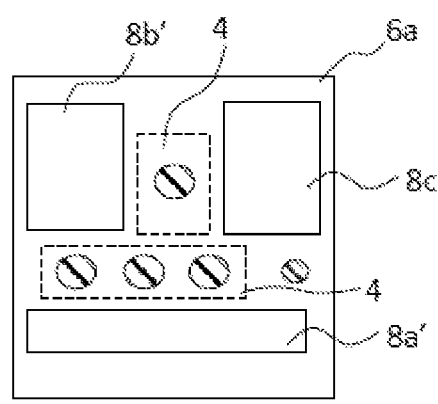

As shown in FIG. 3E, in the case where a third solder bump region 8c is further provided and the number of solder bump regions is three or more, or in the case where there are two or more semiconductor chips 4, the above described adhesion area relationship also is present.

However, in FIG. 3, it is only necessary to provide the adhesive 12 between the semiconductor chip 4 and the wiring substrate 6, and the position, the number, the area, and the like of the solder bump regions and the adhesive(s) are not particularly limited.

According to the semiconductor device of the present embodiment, by providing the adhesive 12 (and 14) partially between the stacked chip body and the wiring substrate 6, it is possible to suppress warping of the wiring substrate 6 and connection failure between the solder bump 8 and the wiring substrate 6. Furthermore, it is possible to reduce interfacial peeling at the surface between the semiconductor chip 4 and the molded resin 7.

Next, a first semiconductor device manufacturing method according to the present embodiment will be described.

Figure 4:
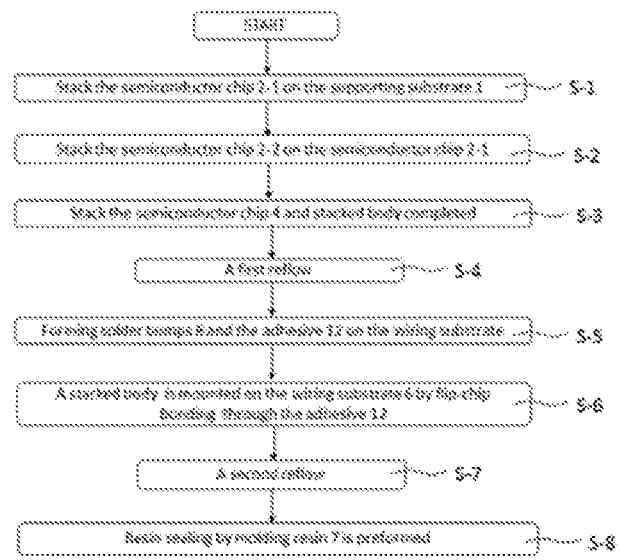
FIG. 4 is a flowchart illustrating the result of steps of the first manufacturing method according to the first embodiment.

FIG. 4 is a flowchart showing steps of first manufacturing method of the semiconductor device according to the present embodiment. FIGS. 5 to 8 are cross-sectional views of the semiconductor device in the XZ plane showing the results of steps of the manufacturing process.

Figure 5A:
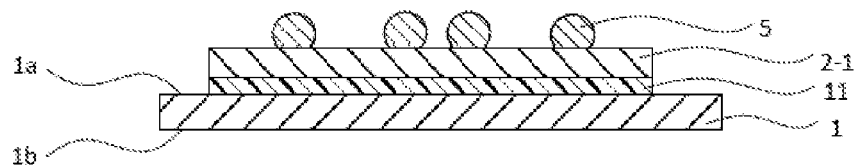
FIGS. 5A and 5B are sectional view of the semiconductor device during a step of the manufacturing method according to the first embodiment.

As illustrated in FIG. 5A, in act S-1 of FIG. 4, the adhesive 11 is provided on the surface of the semiconductor chip 2-1, which is opposite to the surface (first surface) on which the metal bumps 5 are formed, and the adhesive 11 bonds the semiconductor chip 2-1 to the first surface 1a of the supporting substrate 1. Alternatively, the adhesive 11 is provided on the supporting substrate 1 before the semiconductor chip 2-1 is located thereon.

Figure 5B:
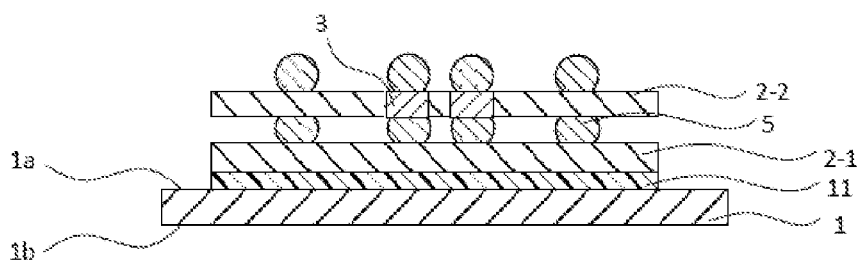

Next, as illustrated in FIG. 5B, in act S-2 of FIG. 4, the semiconductor chip 2-2 in which the through silicon vias 3 were previously formed, and which includes the metal bumps 5, is stacked on the semiconductor chip 2-1. The through silicon vias 3 are formed by, for example, a BSV (Back Side VIA) wafer process. The BSV process is a method for forming TSVs by forming an large scale integration structure (LSI) having semiconductor elements and wirings and front electrodes on a front surface of a substrate, forming holes from a rear surface of the substrate toward the wirings, and embedding a metal into the holes.

Figure 6A:
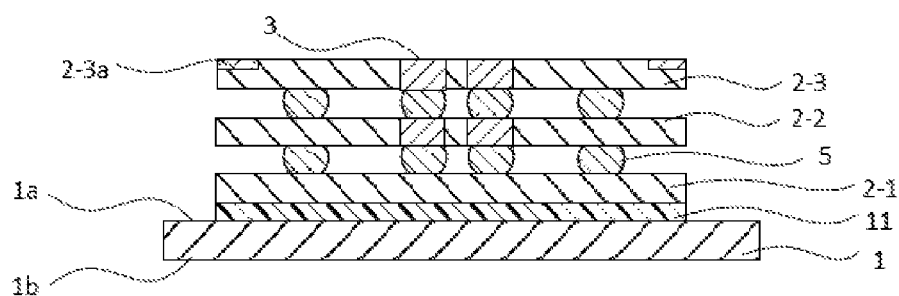
FIGS. 6A and 6B are sectional view of the semiconductor device during a step of the manufacturing method according to the first embodiment.

At this time, in act S-2 of FIG. 4, the semiconductor chip 2-2 is stacked on the semiconductor chip 2-1 so that the through silicon vias 3 formed in the semiconductor chip 2-2 overlie the metal bumps 5 formed on the semiconductor chip 2-1 vertically in the Z-axis direction generally perpendicular to the supporting substrate 1. In a similar fashion, the semiconductor chip 2-3 including the through silicon vias 3 is stacked on the semiconductor chip 2-2 (FIG. 6A). The semiconductor chip 2-3 includes the rewiring layer (not illustrated) and the electrode pads 2-3a on, for example, the surface thereof opposite to the surface thereof facing the semiconductor chip 2-2. The metal bumps 5 may also be formed on the supporting substrate 1 side of the semiconductor chips 2-2 and 2-3 in advance, instead of forming the metal bumps 5 on the semiconductor chip 2-2 in advance, and then stacking the semiconductor chips 2-1 to 2-3 as described above.

Figure 6B:
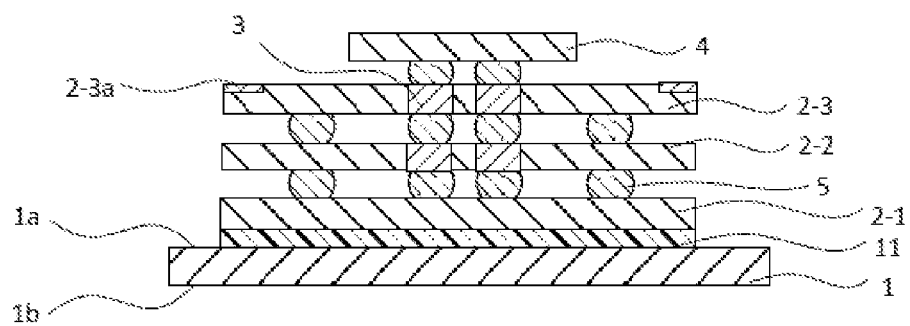

As illustrated in FIG. 6B, in act S-3 of FIG. 4, the semiconductor chip 4 on which the metal bumps 5 are formed is then stacked on the semiconductor chip 2-3. At this time, the metal bumps 5 are positioned so as to be located on the through silicon vias 3 of the semiconductor chip 2-3. It is noted that the rewiring layer may be formed on the surface, which faces the wiring substrate 6, of the semiconductor chip 2-3. In that case, the metal bumps 5 are positioned on the rewiring layer. In this way, the stacked chip body is completed. Thereafter, in act S-4 of FIG. 4, a first reflow (reduction reflow) is performed.

Before the first reflow, the stacked chip body is formed at a temperature lower than the melting temperature of the metal bumps 5 to prevent forming a mechanical connection among the semiconductor chips 2 by the metal bumps 5 during stacking thereof. Thereby, it is possible to reduce the risk of making the metal bumps 5 brittle by repeated melting and solidification of the metal bumps 5 and breaking of the connection sections of the semiconductor chips 2 during stacking the semiconductor chips 2.

Figure 7A:
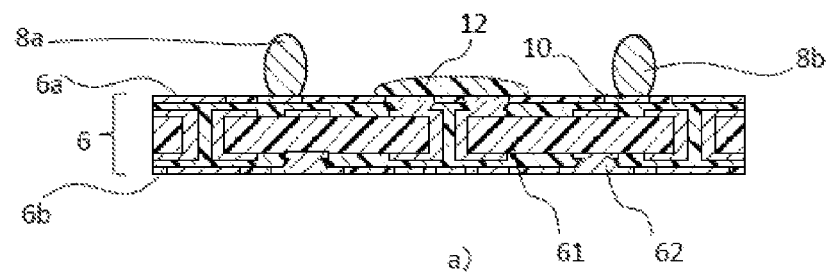
FIGS. 7A and 7B are sectional view of the semiconductor device during a step of the manufacturing method according to the first embodiment.
Figure 7B:
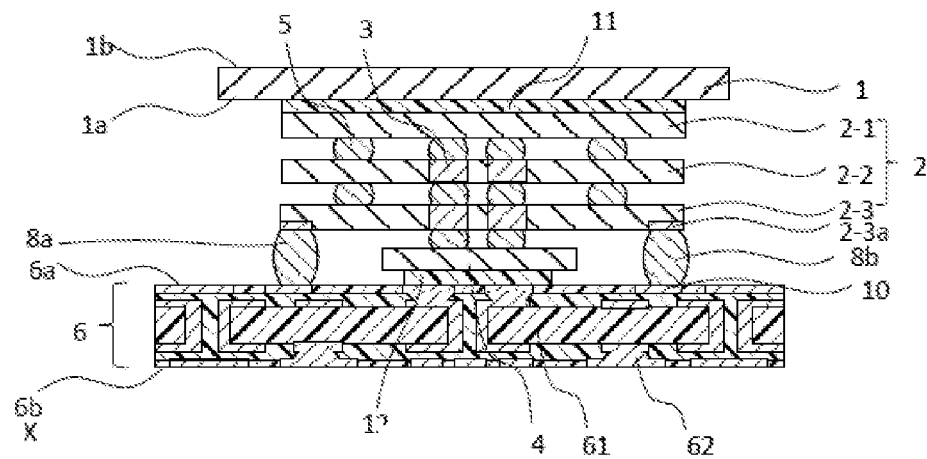

As illustrated in FIG. 7A, 7B, in act S-5 of FIG. 4, the first and second solder bumps 8a, 8b are then formed on the internal connection terminals 10 on the first surface 6a of the wiring substrate 6, and the adhesive 12 is also formed on the wiring substrate, and in act S-6 of FIG. 4, the stacked chip body manufactured as described above is mounted on the first surface 6a by flip-chip bonding. At this time, the stacked chip body is mounted on the first surface 6a of the wiring substrate 6 so that the electrode pads 2-3a formed on the semiconductor chip 2-3 and the solder bumps 8 on the wiring substrate 6 are aligned with each other. Furthermore, the flip-chip bonding may be carried out at a temperature lower than the melting temperature of the first and second solder bumps 8a, 8b formed on the wiring substrate 6.

When the adhesive 14 is provided between the semiconductor chip 2 and the wiring substrate 6, the adhesive 14 can be formed on the wiring substrate 6 simultaneously with the formation of the adhesive 12 where they have the same composition.

Next, in act S-7 of FIG. 4, a second reflow is preformed, the wiring substrate 6 on which the stacked chip body is placed is then heated in a reduction atmosphere to melt the metal bumps 5 on the semiconductor chips 2 and the solder bumps 8 on the wiring substrate 6. Thereby, electrical connection is established among the semiconductor chips 2 and between the stacked chip body and the wiring substrate 6.

Figure 8:
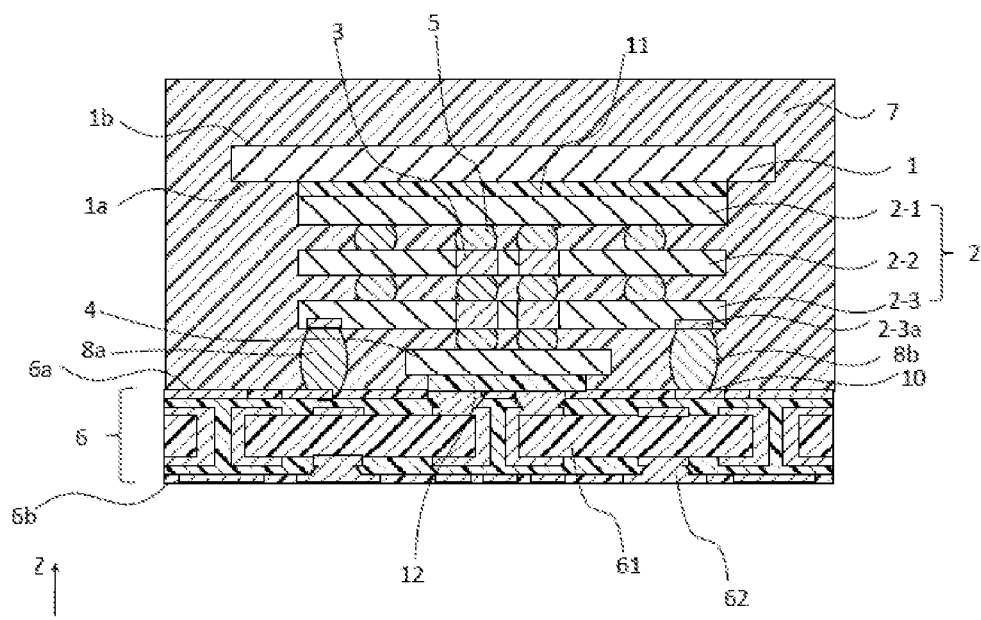
FIG. 8 is a sectional view of the semiconductor device during a step of the manufacturing method according to the first embodiment.

As illustrated in FIG. 8, in act S-8 of FIG. 4, resin sealing is then performed on the wiring substrate 6 using the a molding material to form the molded resin 7 so as to collectively seal gaps among the semiconductor chips 2, and a gap between the stacked chip body and the wiring substrate 6.

Figure 9:
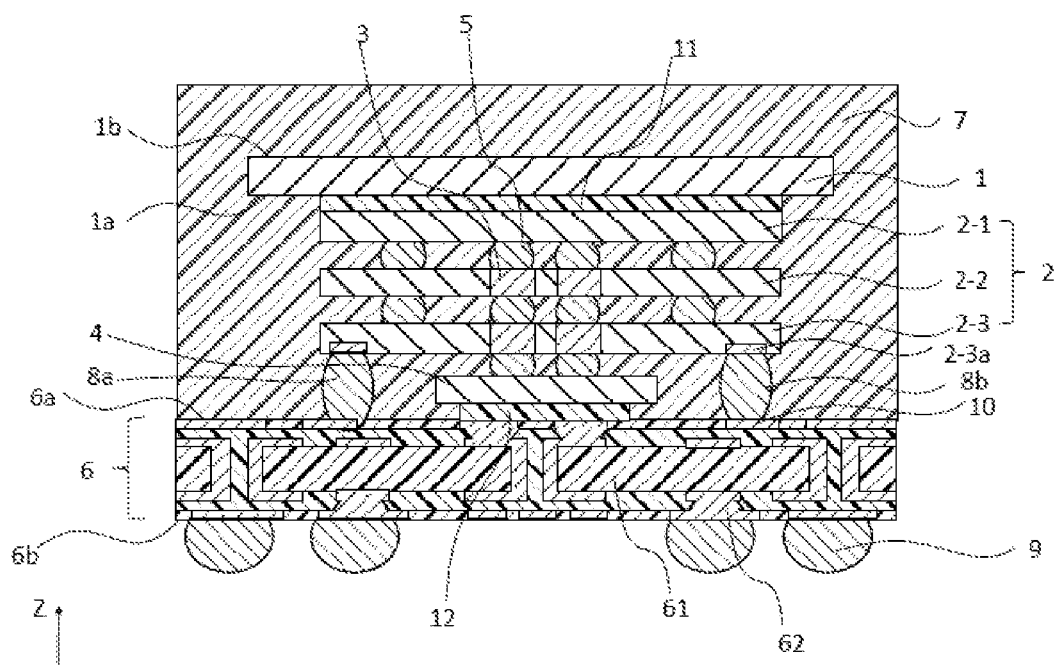
FIG. 9 is a sectional view of the semiconductor device during a step of the manufacturing method according to the first embodiment.

As illustrated in FIG. 9, the external connection terminals 9 are formed on the second surface 6b of the wiring substrate 6. Finally, individual semiconductor devices are diced from the wiring substrate 6 into devices (subjected to singulation) (not illustrated).

Through the aforementioned processes, the semiconductor device according to the present embodiment by the first manufacturing method is completed.

According to the manufacturing method of the semiconductor device of the first manufacturing method, by forming the adhesive 12 on the wiring substrate 6, the stacked chip body can be better adhered to the wiring substrate 6, and better stabilized against warpage, as compared with the case where the adhesive 12 is not used. In addition, since the adhesive 12 is formed between the semiconductor chip 4 and the wiring substrate 6, the adhesive 12 substitutes for the physical support of the wiring substrate 6 so that it suppresses the possibility that gaps occur between the semiconductor chip 4 and the wiring substrate 6 when the molded resin 7 does not fill the gaps between the semiconductor chip 4 and the wiring substrate 6 and thereby creates a gap as a result of adhesion failure as compared with the case without the adhesive 12. Furthermore, it is possible to resin-seal the stacked body at once without filling the space between the chips once with an underfill agent or the like after forming the stacked chip body. Therefore, the number of manufacturing steps can be reduced.

Figure 10:
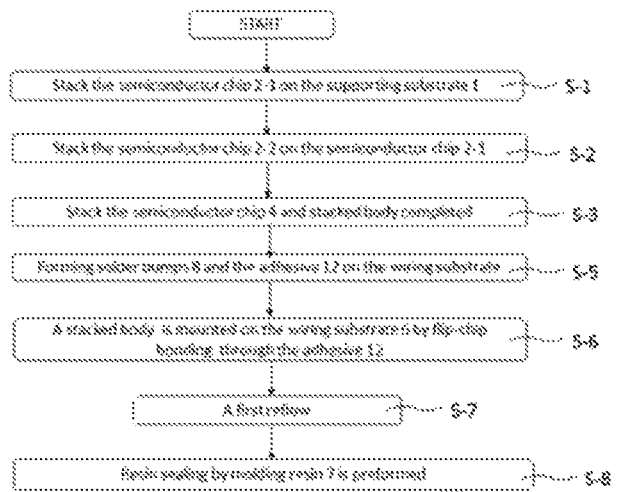
FIG. 10 is a flowchart illustrating other steps of the first manufacturing method according to the first embodiment.

Hereinafter, in the first manufacturing method, there is a method that does not perform the first reflow as shown in FIG. 10. In this case, instead of the first reflow, an adhesive 13 is provided between the semiconductor chips 2 and between the semiconductor chips 2 and 4 to fix the chip stack. The adhesive 13 is provided between the chips when stacking the semiconductor chips 2 and 4 (S-2, 3). The adhesive 13 is applied to the semiconductor chip and then patterned by a photolithography process. In the manufacturing method flow shown in FIG. 10, the stacked chip body fixed together with the adhesive 13 is flip-chip mounted on the wiring substrate 6 and then the first reflow is performed (S-6). As a result, the number of reflow steps is one, so that the number of steps can be further reduced.

In addition, even in the case of manufacturing using the manufacturing method of the flowchart shown in FIG. 4, it is possible to provide the adhesive 13 between the semiconductor chips 2 and between the semiconductor chips 2 and 4 to fix the stack of chips together.

Next, a second manufacturing method of the semiconductor device according to the present embodiment will be described with reference to FIGS. 11 to 13.

FIG. 11 is a flowchart showing the second manufacturing method of the semiconductor device according to the present embodiment. FIGS. 12 and 13 are sectional views of a semiconductor device in the XZ plane showing the results of parts of the manufacturing process. The description of the same parts as those of the first manufacturing method will be omitted.

Figure 12A:
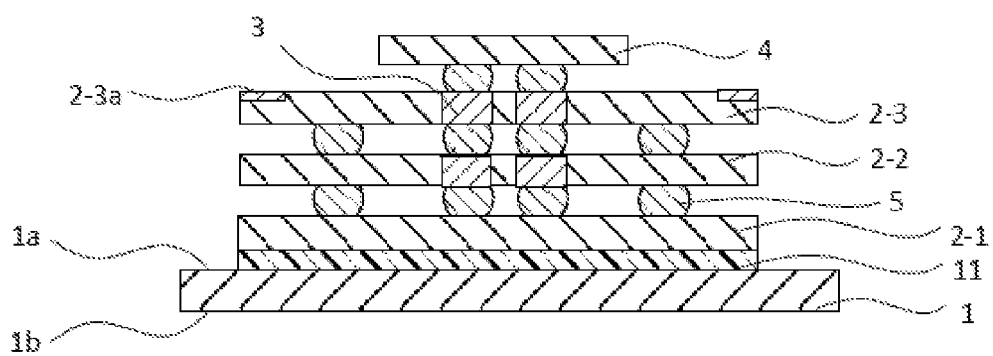
FIGS. 12A and 12B are sectional view of the semiconductor device during a step of the second manufacturing method according to the first embodiment.
Figure 13:
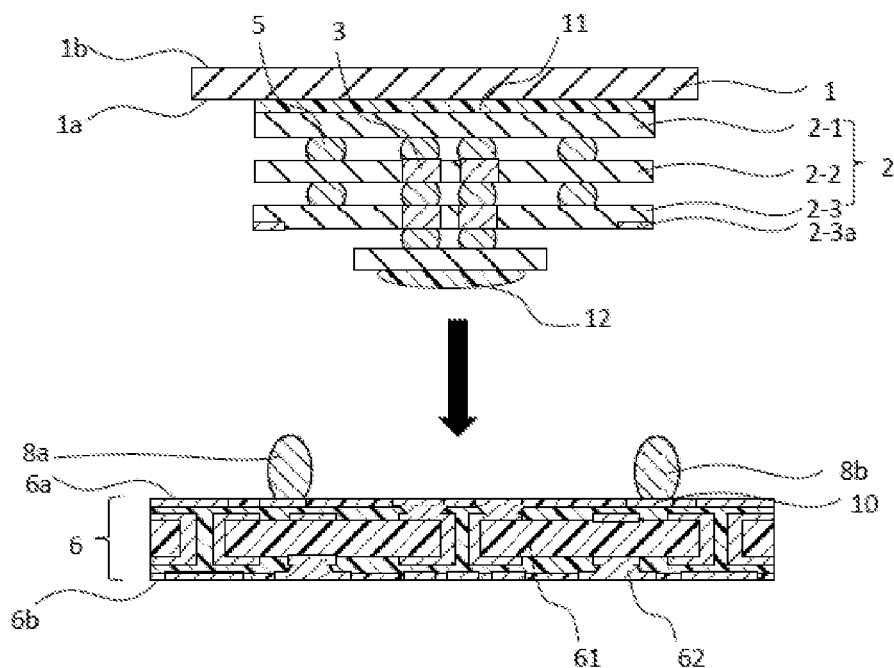
FIG. 13 is a sectional view of the semiconductor device during a step of the second manufacturing method according to the first embodiment.

As shown in FIG. 12A, as in the first manufacturing method, in acts S-1 to S-7 of FIG. 11, a stacked chip body is formed before the first reflow. The adhesive 13 may be provided between the semiconductor chips 2 and between the semiconductor chips 2 and 4 as they are stacked.

Figure 12B:
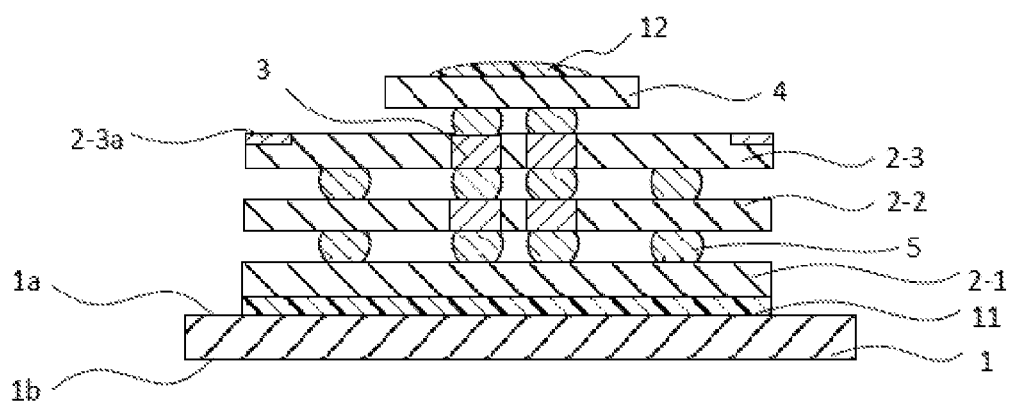

Next, as shown in FIG. 12B, in act S-4 of FIG. 11 the adhesive 12 is applied to the semiconductor chip 4. The adhesive 12 may also be applied to the semiconductor chip 2 as necessary.

In act S-6 of FIG. 11 the stacked chip body in which the adhesive 12 was applied is flip-chip mounted to the wiring substrate 6 on which the solder bumps 8 have been formed.

In the second manufacturing method, when mounting the stacked chip body on the wiring substrate 6, the wiring substrate 6 is set to the curing temperature of the adhesive 12. Therefore, the stacked chip body and the wiring substrate 6 are fixed together by the adhesive 12. Thereafter, in act S-7 of FIG. 11 the wiring substrate 6 and the stacked chip body are electrically connected by reflow. Finally, as in the first manufacturing method, in act S-8 of FIG. 11 the entirety of the wiring substrate 6 is sealed together by the molded resin 7, and the semiconductor device according to the second manufacturing method is completed.

According to the method of manufacturing a semiconductor device according to the second manufacturing method, the same effect as that of the first manufacturing method can be obtained. Furthermore, the adhesive 12 is directly applied to the stacked chip body, which is then mounted on the wiring substrate 6 so that it is possible to set the wiring substrate 6 to the curing temperature of the adhesive 12 during flip chip mounting. For example, in the case of directly applying the adhesive 12 on the wiring substrate 6, if the wiring substrate 6 is set to the curing temperature of the adhesive 12, the adhesive 12 is cured before mounting the stacked chip body thereto, such that the stacked body cannot be adhered to the wiring substrate by the adhesive 12. Therefore, it is necessary to raise the temperature of the stacked chips without raising the temperature of the wiring substrate 6. In addition to applying a load to the stacked chips, in order to raise the temperature of the stacked chips from the supporting substrate 1 side, it takes time until the adhesive 12 reaches to the curing temperature. The load applied on the stacked chip body, for example, deforms the adhesive 13 or the metal bump 5 between the semiconductor chips 2 due to the increased temperature.

As described above, according to the manufacturing method of the semiconductor device according to the second manufacturing method, the mounting time of the stacked chip body is shorter, and it is possible to manufacture a semiconductor device with improved reliability.

A cross-sectional views of the semiconductor device manufactured by the first and second manufacturing methods are an example, and the number of adhesives and the like are not particularly limited.

Second Embodiment

A second embodiment will next be described with reference to FIGS. 14 to 16.

The second embodiment differs from the first embodiment in that a supporting substrate is not used. The remaining configuration is the same as that of the first embodiment.

Figure 14:
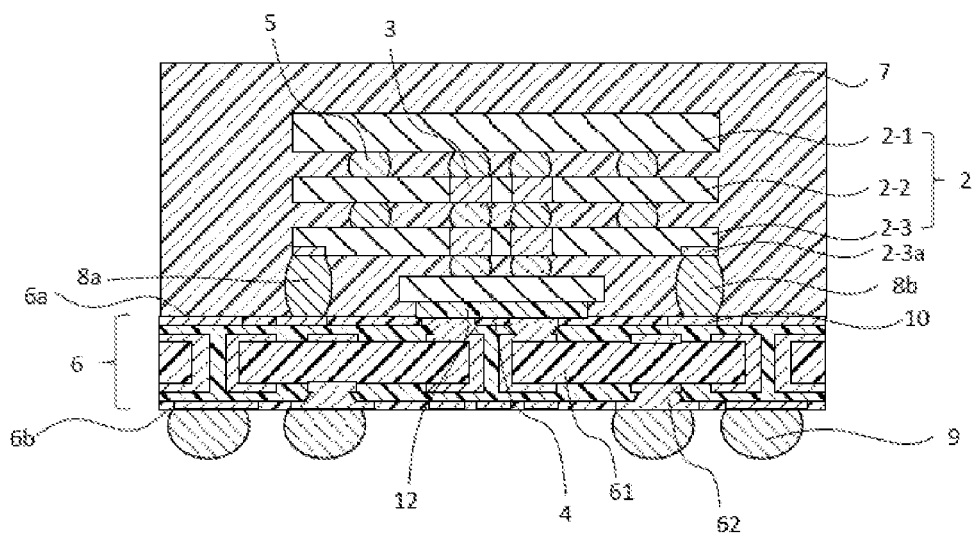
FIG. 14 is a cross-sectional view illustrating a configuration of a semiconductor device according to a second embodiment.

FIG. 14 is a cross-sectional view illustrating a configuration of a semiconductor device according to the second embodiment. As illustrated in FIG. 14, the semiconductor device according to the present embodiment does not use the supporting substrate as does the first embodiment. That is, the semiconductor chip 2-1 is the uppermost chip in the stacked chip body on the wiring substrate. The remaining configuration is the same as that of the first embodiment, and the description thereof will therefore be omitted. Further, in the semiconductor device of FIG. 14, an adhesive 13 may be provided between the semiconductor chips 2 and 4, or an adhesive 14 may be provided between the semiconductor chip 2 and the wiring substrate 6.

Figure 15A:
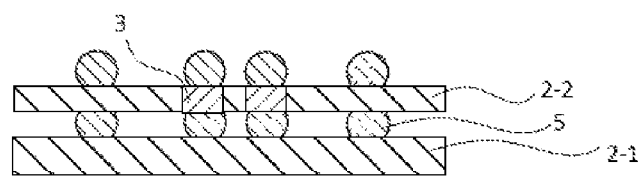
FIGS. 15A and 15B are sectional views of a semiconductor device during steps of the manufacturing method according to the second embodiment.
Figure 15B:
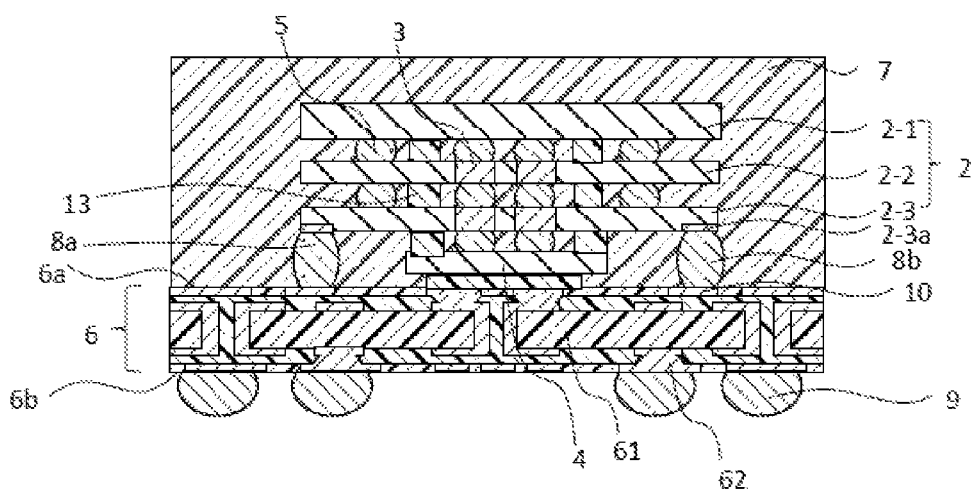

In a semiconductor device manufacturing method according to the second embodiment, the semiconductor chip 2-2 in which the through silicon vias 3 are formed and on which the metal bumps 5 are formed in advance is stacked on the semiconductor chip 2-1 on which the metal bumps 5 are formed in advance, as illustrated in FIG. 15A. The semiconductor chip 2-2 is stacked on the semiconductor chip 2-1 so that the metal bumps 5 on the semiconductor chip 2-1 positionally overlap the through silicon vias 3 in the semiconductor chip 2-2 in the Z-axis direction generally perpendicular to the semiconductor chip 2-1. Subsequent processes are the same as those in the first embodiment, and a discussion thereof will be omitted. As illustrated in FIG. 15B, the adhesives 13 may be located between the semiconductor chips 2, and the adhesive 14 may be used between the stacked chip body and the wiring substrate 6.

The semiconductor device according to the present embodiment described so far exhibits the same advantages as those of the first embodiment, and further can achieve reductions in the number of processes and cost since the stacked chip body can be formed without using the supporting substrate as compared with the first embodiment.

The other manufacturing method according to the second embodiment will next be described with reference to FIGS. 16A and 16B.

The other manufacturing method differs from the former manufacturing method according to the first embodiment in that a tape material is used in place of an adhesive. The remainder of the manufacturing method is the same as the former manufacturing method according to the first embodiment in other respects.

Figure 16A:
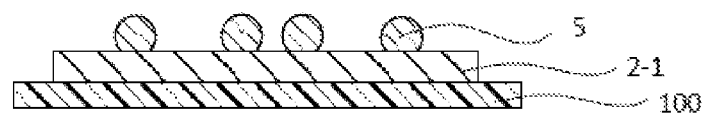
FIGS. 16A and 16B are sectional views of a semiconductor device during steps of the manufacturing method according to the second embodiment.

As illustrated in FIG. 16A, an adhesive tape material 100 is prepared and the semiconductor chip 2-1 on which the metal bumps 5 are formed is adhesively bonded onto the tape material 100. The shape and material composition of the tape material 100 can be selected arbitrarily as long as the tape material 100 is, for example, a single-sided adhesive tape material. Subsequently, the stacked chip body is formed similarly to the former manufacturing method according to the second embodiment. The tape material 100 is peeled off from the stacked chip body after the metal bumps 5 of the stacked chip body have been electrically connected to the through silicon vias in the reduction atmosphere or the like. The tape material 100 is peeled off by, for example, a pickup tool A and a vacuum chuck tool B.

Figure 16B:
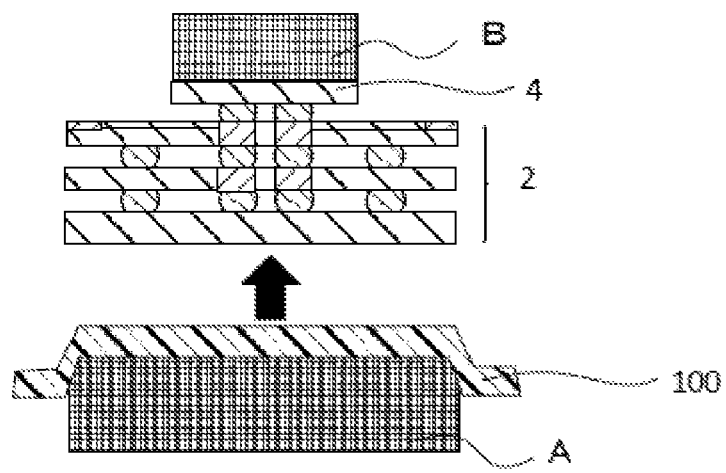

FIG. 16B illustrates a method for peeling off the tape material 100 using the pickup tool A and the vacuum chuck tool B. The stacked chip body is lifted up by the pickup tool A while at the same time, the semiconductor chip 4 in the chip stacked body is attracted by the vacuum chuck tool B. Thereby, the tape material 100 can be peeled off from the stacked chip body. The semiconductor chip to be attracted to the vacuum chuck tool B at this time may be any of the semiconductor chips 2. Subsequently, the remainder of the manufacturing method is the same as the former manufacturing method described in the second embodiment.

The other semiconductor device manufacturing method according to the present embodiment described so far exhibits the same advantages as those of the first embodiment, and further can achieve a reduction in an area of the semiconductor device since the tape material is peeled off later as compared with the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device, comprising:
a wiring substrate comprising a first surface;
a stacked body on the first surface, the stacked body comprising a first chip, a second chip between the first chip and the first surface, and a third chip between the second chip and the first surface;
a first resin contacting the first surface and the third chip;
a second resin sealing the stacked body; and
a third resin located between the wiring substrate and the second chip and directly contacting the first surface and the second chip, wherein
the second chip has a through via extending therethrough,
a portion of the second resin is between the wiring substrate and the second chip,
the second resin is in contact with the first surface and the second chip,
the first and second resins are different materials, and
the second and third resins are different materials.
2. The semiconductor device of claim 1, further comprising:
a fourth resin contacting the first chip and the second chip, wherein
the second and fourth resins are different materials.
3. The semiconductor device of claim 2, wherein an elastic modulus of the first resin is less than an elastic modulus of the fourth resin, which is less than an elastic modulus of the second resin.
4. The semiconductor device of claim 2, wherein a glass transition temperature of the first resin is less than a glass transition temperature of the fourth resin, which is less than a glass transition temperature of the second resin.
5. The semiconductor device of claim 2, wherein a thermal expansion coefficient of the second resin is less than a thermal expansion coefficient of the first resin, which is less than a thermal expansion coefficient of the fourth resin.
6. The semiconductor device according to claim 1, wherein the portion of the second resin that is located between the wiring substrate and the second chip directly contacts the first surface and the second chip.
7. The semiconductor device according to claim 1, wherein the portion of the second resin is between the wiring substrate and the second chip along a direction orthogonal to the first surface.
8. The semiconductor device according to claim 1, wherein the third chip is smaller in size than the second chip.
9. A semiconductor device, comprising:
a wiring substrate comprising a first surface;
a stacked body on the first surface, the stacked body comprising a first chip, a second chip between the first chip and the first surface, and a third chip between the second chip and the first surface;
a first resin contacting the first surface and the third chip;
a second resin sealing the stacked body;

a third resin located between the wiring substrate and the second chip and directly contacting the first surface and the second chip;

a first solder bump connecting the first surface of the wiring substrate and the second chip; and a second solder bump connecting the first surface of the wiring substrate and the second chip, wherein the second chip has a through via extending therethrough, a portion of the second resin is between the wiring substrate and the second chip, the second resin is in contact with the first surface and the second chip, the first and second resins are different materials, the second and third resins are different materials, the third chip is between the first and second solder bumps, and the second resin is between third chip and the first and second solder bumps.

10. The semiconductor device according to claim 9, wherein the second resin contacts the first and second solder bumps.

11. The semiconductor device according to claim 9, wherein the portion of the second resin that is located between the wiring substrate and the second chip directly contacts the first surface and the second chip.

12. The semiconductor device according to claim 9, wherein the portion of the second resin is between the wiring substrate and the second chip along a direction orthogonal to the first surface.

13. The semiconductor device according to claim 9, wherein the third chip is smaller in size than the second chip.

* * * * *